US006541296B1

(12) United States Patent
Sherman et al.

(10) Patent No.: US 6,541,296 B1
(45) Date of Patent: Apr. 1, 2003

(54) METHOD OF FORMING ELECTROLUMINESCENT CIRCUIT

(75) Inventors: Louis R. Sherman, Botkins, OH (US); Allan G. Bruns, St. Henry, OH (US); Robert N. Card, Sidney, OH (US); Frank J. Catanzarite, Sidney, OH (US); Stephen C. Hatkevich, Maumee, OH (US); Debra L. Mayberry, Botkins, OH (US); Treva C. Monnier, Tipp City, OH (US); Roger S. J. Naguit, Kettering, OH (US); Michael E. Purdy, Troy, OH (US); Jeffery D. Sanford, Sidney, OH (US)

(73) Assignee: American Trim, LLC, Lima, OH (US)

( * ) Notice: Subject to any disclaimer, the term of this patent is extended or adjusted under 35 U.S.C. 154(b) by 0 days.

(21) Appl. No.: 09/993,880

(22) Filed: Nov. 14, 2001

(51) Int. Cl.[7] .............................. H01L 21/00; H01J 1/62

(52) U.S. Cl. ......................... 438/30; 313/110; 313/510; 313/506; 313/507; 313/509; 313/117; 438/31; 438/22; 438/29

(58) Field of Search ............................. 438/30, 29, 22, 438/31; 313/110, 117, 506, 507, 509, 510, 513

(56) References Cited

U.S. PATENT DOCUMENTS

| | | | | | |
|---|---|---|---|---|---|
| 4,104,555 | A | * | 8/1978 | Fleming | 313/512 |
| 4,143,297 | A | * | 3/1979 | Fischer | 313/502 |
| 4,532,454 | A | * | 7/1985 | Abdalla | 313/506 |
| 5,646,481 | A | * | 7/1997 | Zovko | 313/510 |
| 5,660,573 | A | * | 8/1997 | Butt | 445/24 |
| 5,686,792 | A | * | 11/1997 | Ensign, Jr. | 313/509 |
| 5,756,147 | A | * | 5/1998 | Wu et al. | 408/30 |
| 5,830,028 | A | | 11/1998 | Zovko et al. | 445/24 |
| 6,054,809 | A | | 4/2000 | Haynes et al. | 313/505 |
| 6,069,444 | A | | 5/2000 | Krafcik et al. | 313/510 |
| 6,144,156 | A | | 11/2000 | Lutschounig et al. | 313/506 |
| 6,183,330 | B1 | | 2/2001 | Peterson et al. | 445/24 |
| 6,203,391 | B1 | * | 3/2001 | Murasko | 445/24 |
| 6,255,776 | B1 | | 7/2001 | Peterson et al. | 313/506 |
| 6,411,726 | B1 | * | 6/2002 | Pires | 382/124 |
| 6,424,088 | B1 | * | 7/2002 | Murasko | 382/124 |
| 6,433,476 | B1 | * | 8/2002 | Pacicrek et al. | 313/509 |
| 6,445,128 | B1 | * | 9/2002 | Bush et al. | 313/509 |
| 6,465,969 | B1 | * | 10/2002 | Murasko et al. | 315/169.3 |

FOREIGN PATENT DOCUMENTS

| | | |
|---|---|---|
| WO | 9849873 | 11/1998 |
| WO | 9930304 | 6/1999 |

* cited by examiner

*Primary Examiner*—Matthew Smith
*Assistant Examiner*—V. Yevsikov
(74) *Attorney, Agent, or Firm*—Rankin, Hill, Porter & Clark LLP

(57) ABSTRACT

The present invention provides a method of forming an electroluminescent circuit by screen printing. The method according to the invention includes screen printing a rear electrode pattern on a substrate, which is preferably a polyester sheet, screen printing a dielectric layer over the rear electrode pattern, screen printing a front electrode pattern on the dielectric layer, and screen printing a phosphor layer over the front electrode layer. The rear electrode pattern preferably includes a solid layer disposed upon the substrate and the front electrode pattern preferably includes a plurality of opaque lines separated by spaces. In an alternative embodiment, the method according to the invention includes screen printing the phosphor layer on the substrate, screen printing the front electrode pattern on the phosphor layer, screen printing the dielectric layer over the front electrode pattern, and screen printing the rear electrode pattern over the dielectric layer.

20 Claims, 3 Drawing Sheets

METHOD OF FORMING ELECTROLUMINESCENT CIRCUIT

FIELD OF INVENTION

The present invention provides a method of forming an electroluminescent circuit, and more particularly to a method of forming an electroluminescent circuit utilizing screen printing technology.

BACKGROUND OF THE INVENTION

A prior art electroluminescent circuit 10 is schematically represented in crosssection in FIG. 1. This type of electroluminescent circuit consists of a substrate 20, which is typically a polyester sheet, having a plurality of interleaved first conductor segments 30 and second conductor segments 40 screen printed thereon. A dielectric layer 50 is screen printed over the interleaved conductor segments 30, 40, and a phosphor layer 60 is screen printed over the dielectric layer 50. Application of an alternating current voltage across the interleaved conductor segments 30, 40 generates a changing electric field within the phosphor layer 60, which causes the phosphor layer 60 to emit light.

FIG. 2 is a schematic representation showing a top plan-view of the interleaved conductor segments 30, 40 in the electroluminescent circuit 10 schematically represented in FIG. 1. The interleaved conductor segments 30, 40 typically have a width of 5 mils and are separated by spaces that are 5 mils in width. Due to the narrowness of the conductor segments 30, 40 and their relatively close proximity to each other, it is very difficult to produce the print screens necessary to print the interleaved conductor segments 30, 40 and/or to consistently print the interleaved conductor segments 30, 40 using the print screens. The main problems with screen printing the interleaved conductor segments 30, 40 are the formation of voids or breaks in the conductor segments 30, 40, which can result in the appearance non-illuminated areas in the electroluminescent circuit, and the formation of conductor segments that touch, which results in a short. Generally, when a short occurs in an electroluminescent circuit of this type, no portion of the circuit is illuminated.

Electroluminescent circuits of the type schematically represented in FIG. 1 are highly desirable because they can be formed using screen printing technology, they are formable and flexible because they do not contain sputtered indium tin oxide (ITO), and because they produce excellent light output at low power. However, because the average yield of satisfactory electroluminescent circuits of this type is only approximately 1% to 5% according to current fabrication methods, a new method of fabricating electroluminescent circuits by screen printing is needed.

SUMMARY OF INVENTION

The present invention provides a method of forming an electroluminescent circuit by screen printing. The method of the present invention comprises screen printing a rear electrode pattern on a substrate, screen printing a dielectric layer over the rear electrode pattern, screen printing a front electrode pattern on the dielectric layer, and screen printing a phosphor layer over the front electrode layer. The rear electrode pattern is preferably formed of a silver conductive ink and comprises a solid layer disposed on the substrate. The front electrode pattern is also preferably formed of a silver conductive ink and comprises a plurality of opaque lines separated by spaces. The width of the lines is preferably about 5 to about 15 mils, and the lines are preferably separated by spaces that are about 5 to about 25 mils in width. In an alternative embodiment, the method of forming an electroluminescent circuit comprises screen printing a phosphor layer on a substrate, screen printing a front electrode pattern on the phosphor layer, screen printing a dielectric layer over said front electrode pattern, and screen printing a rear electrode pattern over the dielectric layer.

The method of the present invention provides several advantages over prior art methods used to fabricate electroluminescent circuits. For example, because the electrodes are separated by a dielectric layer, there is no possibility that shorts can occur. Furthermore, even if there is a void or break in an opaque lines, or if the opaque lines touch, the electroluminescent circuit still illuminates because the lines are powered from both sides of the break or void. Thus, the yield of satisfactory electroluminescent circuits fabricated according to the method of the invention is substantially higher than the yield of satisfactory electroluminescent circuits fabricated according to conventional methods.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF PREFERRED EMBODIMENTS

Figure 3:
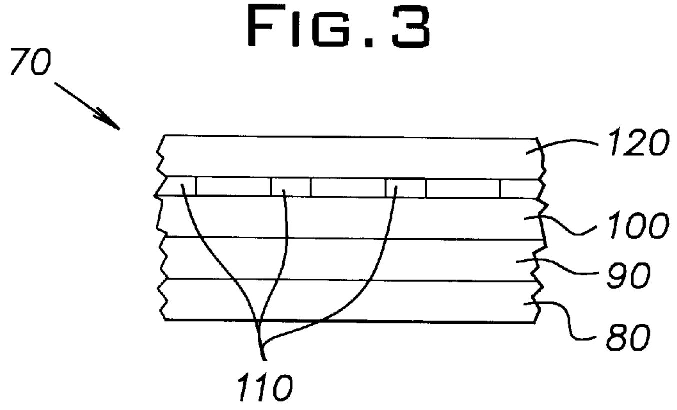
FIG. 3 is a schematic representation showing a cross-section of an electroluminescent circuit formed according to the method of the present invention.
Figure 4A:
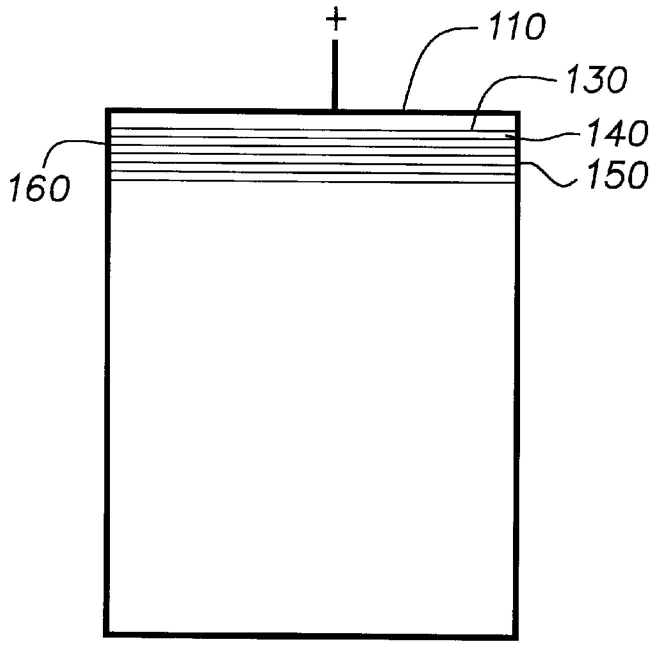
FIGS. 4*a* and 4*b* are schematic representations showing top plan-views of portions of the electroluminescent circuit schematically represented in FIG. 3.
Figure 4B:
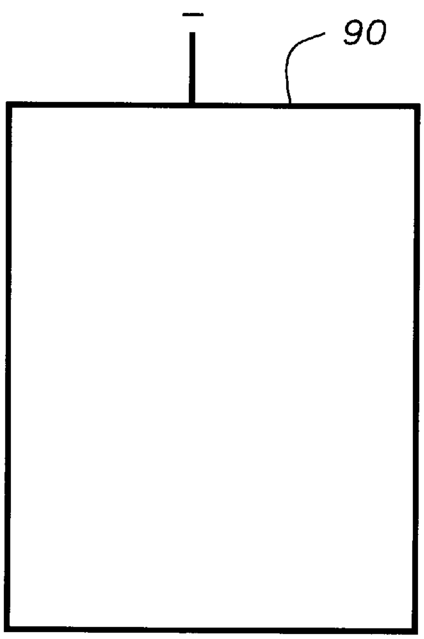

With reference to FIG. 3, an electroluminescent circuit 70 formed according to the method of the invention comprises a substrate 80, a rear electrode pattern 90 that is preferably screen printed onto the substrate 80, a dielectric layer 100 that is screen printed over the rear electrode pattern 90, a front electrode pattern 110 that is screen printed over the dielectric layer 100, and a phosphor layer 120 that is screen printed over the front electrode pattern 110. With reference to FIG. 4*a,* the front electrode pattern 110 comprises a plurality of opaque lines that are separated by spaces. And, with reference to FIG. 4*b,* the rear electrode pattern 90 preferably comprises a solid layer of conductive material.

The substrate 80 preferably comprises a polyester sheet material, such as polyethylene terephthalate (PET) or polyethylene naphthalate (PEN). However, it will be appreciated that other materials such as, for example, coated aluminum, polymers, glass, ceramics, and composites, can be used as substrates.

The rear electrode pattern 90 is preferably formed of screen printed conductive ink. The presently most preferred conductive ink for use in the method of the invention is a silver conductive ink sold by Acheson Colloids Co. of Port Huron, Mich. under the trade designation ELECTRODAG 479SS. Other suitable conductive inks are available from DuPont Microcircuit Materials under the LUXPRINT trade designation. A polyester screen can be used to print the rear electrode pattern, which preferably comprises a solid layer of conductive material. The rear electrode pattern is formed by screen printing the conductive ink onto the substrate, and then heating the substrate to cure the ink and fix the rear electrode pattern to the substrate.

Once the rear electrode pattern 90 has been fixed to the substrate, a dielectric layer 100 is applied over the rear electrode pattern 90 by screen printing. A preferred composition for use in forming the dielectric layer is available from DuPont Microcircuit Materials under the trade designation LUXPRINT 7153E. This material can be applied using a suitably sized polyester screen and then cured by heating. Typically, the dielectric layer 100 is formed using two or more print passes, wet on wet. The dry film thickness of the dielectric layer 100 is preferably a minimum of about 1.5 mils.

After the dielectric layer 100 has been cured, the front electrode pattern 110 is screen printed onto the dielectric layer 100. The front electrode pattern 110 is preferably formed of a conductive ink, which can be the same as the conductive ink used to form the rear electrode pattern 90.

The front electrode pattern 110 comprises a plurality of opaque lines 130 that are separated by spaces 140. The width of the opaque lines 130 is preferably about 5 to about 15 mils, and more preferably about 5 mils. The opaque lines 130 are separated by spaces 140 that are about 5 to about 25 mils in width, and more preferably about 15 mils in width. The term "opaque" means that the conductive material used to form the opaque lines 130 is not transparent or translucent material.

As shown in FIG. 4*a*, the opaque lines 130 are preferably connected on both ends to bus bars 150, 160. Thus, if a void is formed in an opaque line 130, or a break occurs, the opaque line 130 is powered from both ends and the entire length of the opaque line 130 on either side of the void or break can still carry a charge and can thus create the electric field necessary to cause the phosphor layer 120 to emit light.

Once the front electrode pattern 110 has been screen printed and cured onto the dielectric layer 100, a phosphor layer 120 is applied over the front electrode pattern 110 by screen printing. The phosphor layer preferably comprises encapsulated phosphor materials, which are well known. Suitable phosphor materials are available, for example, from Osram-Sylvania of Towanda, Pa. under the trade designation ANE and from DuPont Microcircuit Materials under the trade designation LUXPRINT. The phosphor layer 120 is preferably applied using two or more print passes using a polyester screen, wet on wet, and then cured by heating.

An electroluminescent circuit fabricated in accordance with the method of the present invention can be further coated or encapsulated to protect the phosphor layer 120. In addition, the phosphor layer 120 can be overprinted using inks or masks to sharpen the illuminated image thereunder.

To operate an electroluminescent circuit formed according to the method of the invention, the rear electrode pattern and front electrode pattern must be charged with an alternating current, which creates an electric field which causes excitation of the phosphor light emitter. An electroluminescent circuit formed according to the method of the invention can be operated with variable voltage and hertz. A typical voltage and hertz is 175 volts, 400 hertz.

Figure 5:
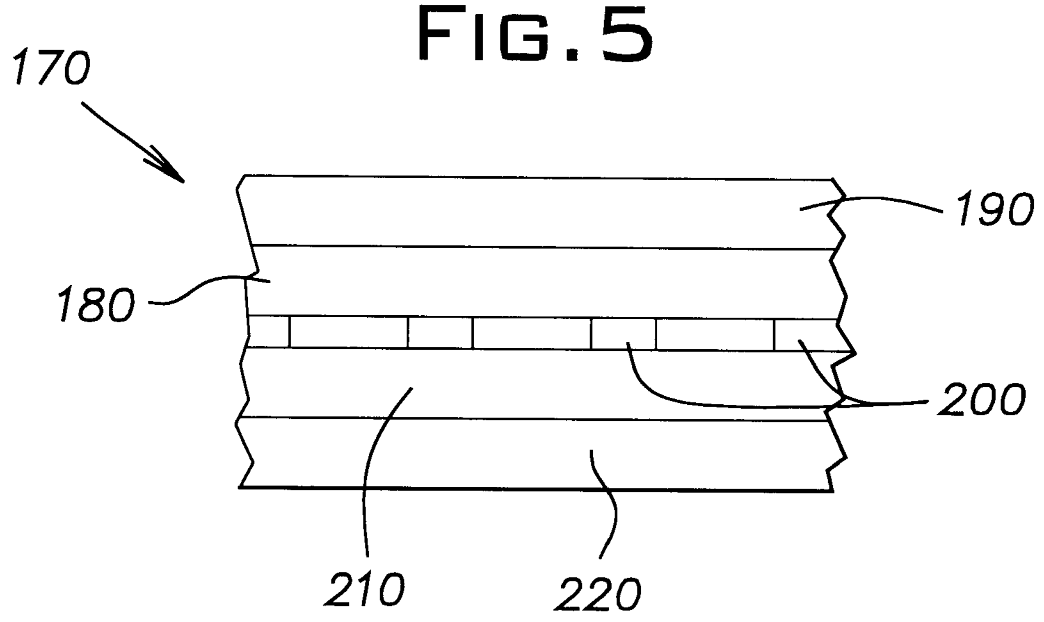
FIG. 5 is a schematic representation showing a cross-section of an electroluminescent circuit formed according to an alternative embodiment of the method of the present invention.

With reference to FIG. 5, in an alternative embodiment of the method of the invention, an electroluminescent circuit 170 is formed by screen printing a phosphor layer 180 on a substrate 190, screen printing a front electrode pattern 200 on the phosphor layer 180, screen printing a dielectric layer 210 over the front electrode pattern 200, and screen printing a rear electrode pattern 220 over said dielectric layer 210. In this embodiment, the front electrode pattern 200 preferably comprises a plurality of opaque lines separated by spaces, such as shown in FIG. 4*a*.

Figure 6:
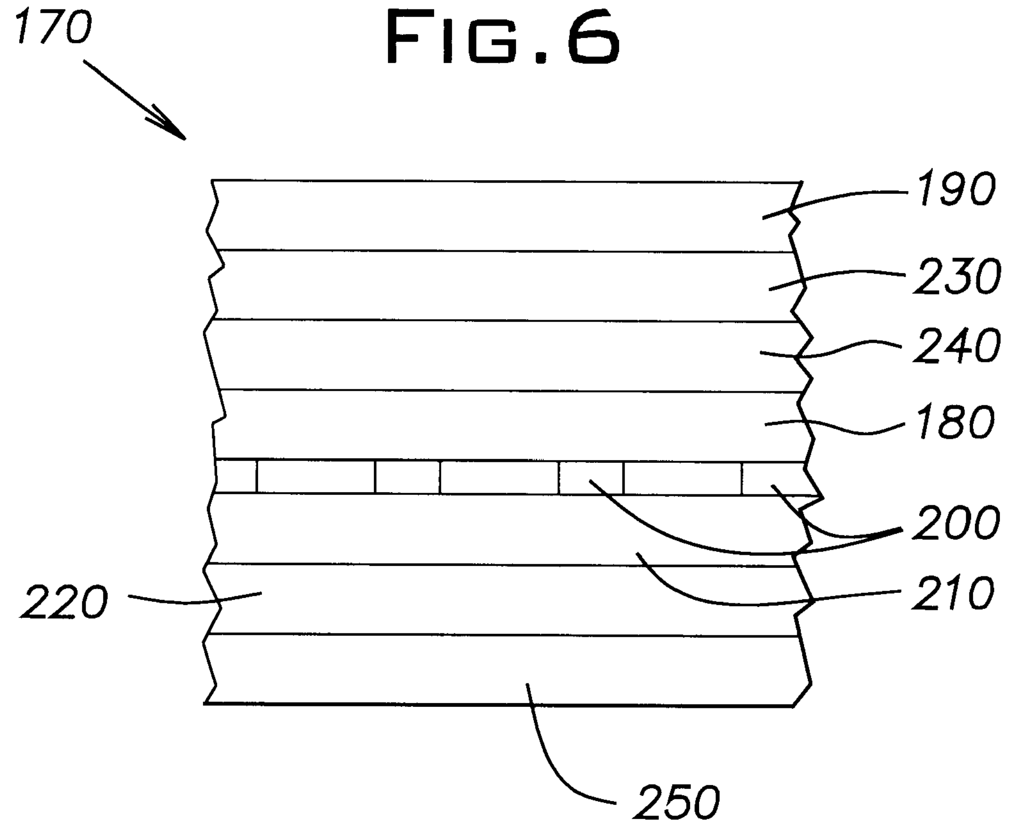
FIG. 6 is a schematic representation showing a cross-section of another electroluminescent circuit formed according to an alternative embodiment of the method of the present invention.

With reference to FIG. 6, it will be appreciated that one or more opaque ink layers 230 and/or transparent ink layers 240 can be disposed between the substrate 190 and the phosphor layer 180 in this embodiment of the invention. Furthermore, an adhesive layer 250 can optionally be screen printed or laminated onto the rear electrode pattern 220 in order to provide a means of mounting the electroluminescent circuit 170 onto a surface.

The method according to the present invention facilitates the fabrication of formable electroluminescent circuits by screen printing. Because the front electrode is separated from the rear electrode by a dielectric layer, there is no risk that the lines of the opposing electrodes can come into contact and produce a short. The inventive method thus allows for much higher yields of satisfactory electroluminescent circuits during production. Laboratory trials showed that the method of the invention produced satisfactory electroluminescent circuits at a rate that was thirty-five times higher than conventional methods.

Furthermore, since the lines of the front electrode pattern are separated by a wider spaces and are preferably powered via a connection to a bus bar on both ends, there is a reduced likelihood of having a dark area on the electroluminescent circuit caused by a void or line break. In other words, if there is a void or break in the line, the line will still light except in the spot where the void or break occurred.

Figure 1:
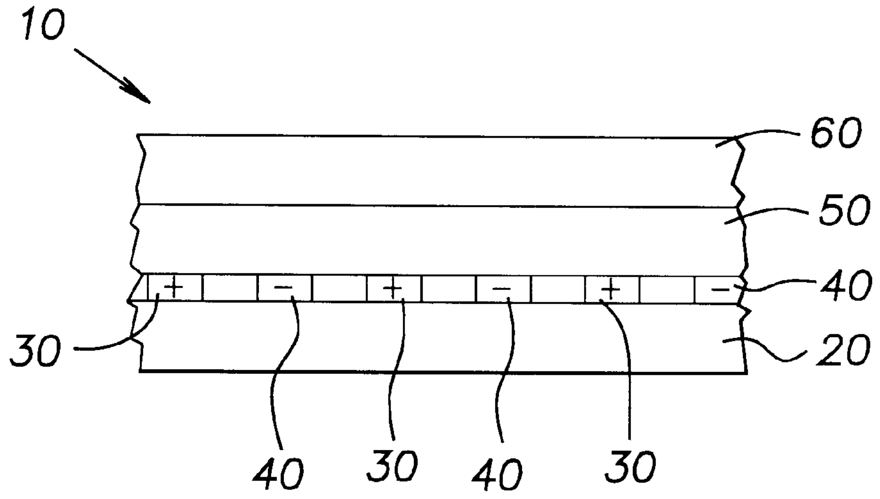
FIG. 1 is a schematic representation showing a cross-section of a prior art electroluminescent circuit.
Figure 2:
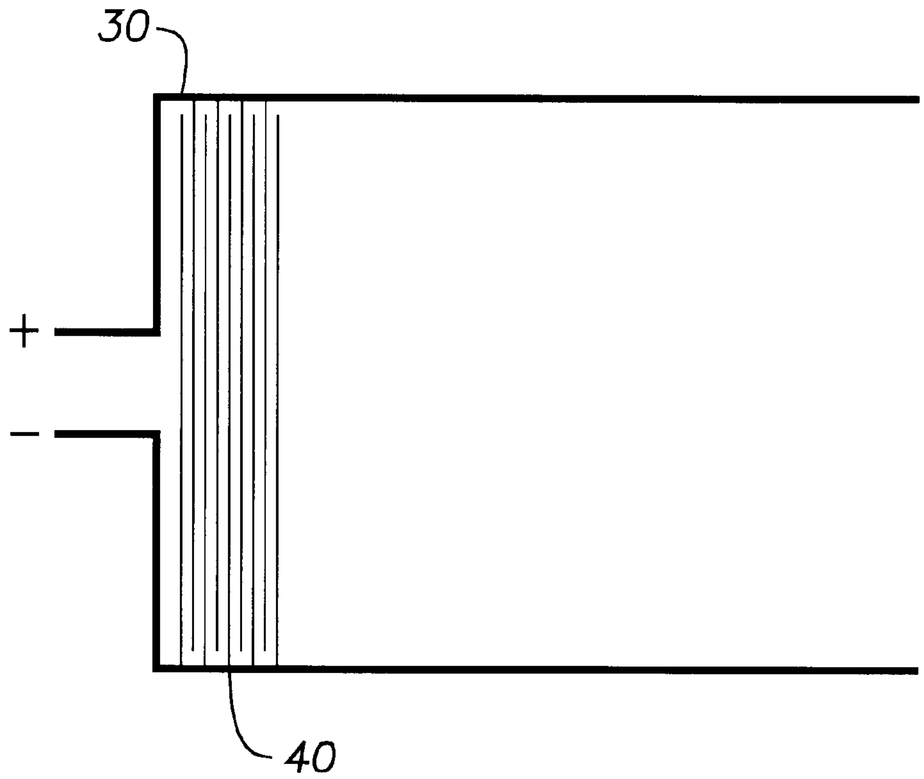
FIG. 2 is a schematic representation showing a top plan-view of a portion of the prior art electroluminescent circuit schematically represented in FIG. 1.

Another advantage provided by the method of the present invention is that the phosphor layer and the front electrode pattern are in contact with each other, rather than being separated by a dielectric layer. The closer proximity of the phosphor layer to the front electrode pattern improves the efficiency of the electroluminescent circuit. Thus, an electroluminescent circuit formed according to the method of the invention will generally emit a brighter light at lower current levels. For example, an electroluminescent circuit formed in accordance with FIGS. 1 and 2 with 5 mil lines and 5 mil spaces must be powered at 220 volts/400 hertz in order to yield the same light output as an electroluminescent circuit formed in accordance with the method of the invention with 5 mil lines and 15 mil spaces powered at 175 volts/400 hertz.

The following examples are intended only to illustrate the invention and should not be construed as imposing limitations upon the claims.

EXAMPLE 1

An electroluminescent circuit according to the present invention was formed by passing a substrate comprising a 10 mil polyester sheet (PET) through a 250° F. conveyorized dryer for 1.5 minutes to minimize shrinkage of the substrate upon subsequent heating.

A rear electrode pattern was then formed on the polyester sheet by screen printing a silver conductive ink sold under the trade designation ELECTRODAG 479SS by Acheson Colloids Co. of Port Huron, Mich. through a 460 mesh polyester screen. The rear electrode pattern comprised a solid layer of silver conductive ink having a wet film thickness of about 0.5 mils. The polyester sheet was then passed through the 250° F. conveyorized dryer for 1.5 minutes to cure the silver conductive ink.

A dielectric layer was then applied over the rear electrode pattern by screen printing a dielectric composition sold under the trade designation 7153 by DuPont Electronics of Research Triangle Park, N.C. through a 76 mesh polyester screen. The formation of the dielectric layer required two print passes, wet on wet. The dielectric layer was cured by passing the polyester sheet through the 250° F. conveyorized dryer for 1.5 minutes. The dry film thickness of the dielectric layer was about 1.6 mils.

A front electrode pattern was then applied over the dielectric layer by screen printing a silver conductive ink sold under the trade designation ELECTRODAG 479SS by Acheson Colloids Co. of Port Huron, Mich. through a 325 mesh stainless steel screen. The second electrode pattern comprised a plurality of lines having a width of about 5 mils that were spaced apart from each other a distance of about 15 mils. The wet film thickness of the front electrode pattern was about 0.5 mils. The polyester sheet was then passed through the 250° F. conveyorized dryer for 1.5 minutes to cure the silver conductive ink.

A phosphor layer was then applied over the front electrode pattern by screen printing a composition comprising a blend of about 2 parts by weight phosphor sold under the trade designation ANE 430 by Osram Sylvania of Towanda, Pa., and 1 part by weight DuPont Electronics 7155 Membrane Switch Composition (clear) through a 76 mesh polyester screen. The formation of the phosphor layer required two print passes, wet on wet. The phosphor layer was cured by passing the polyester sheet through a 250° F. conveyorized dryer for 1.5 minutes. The dry film thickness of the phosphor layer was about 0.8–1.0 mils.

The electroluminescent circuit was then placed into a convection oven heated at a temperature of 250° for 10 minutes to fully cure the applied layers. When powered at with an alternating current at 175V/400 hz, the electroluminescent circuit yielded about 8 foot candles of light.

EXAMPLE 2

An electroluminescent circuit was formed according to an alternative embodiment of the method of the present invention by passing a substrate comprising a 10 mil polyester sheet (PET) through a 250° F. conveyorized dryer for 1.5 minutes to minimize shrinkage of the substrate upon subsequent heating.

A phosphor layer was formed on the polyester sheet by screen printing a composition comprising a blend of about 2 parts by weight phosphor sold under the trade designation ANE 430 by Osram Sylvania of Towanda, Pa., and 1 part by weight DuPont Electronics 7155 Membrane Switch Composition (clear) through a 76 mesh polyester screen. The formation of the phosphor layer required two print passes, wet on wet. The phosphor layer was cured by passing the polyester sheet through a 250° F. conveyorized dryer for 1.5 minutes. The dry film thickness of the phosphor layer was about 0.8–1.0 mils.

A front electrode pattern was then applied over the phosphor layer by screen printing a silver conductive ink sold under the trade designation ELECTRODAG 479SS by Acheson Colloids Co. of Port Huron, Mich. through a 325 mesh stainless steel screen. The front electrode pattern comprised a plurality of lines having a width of about 5 mils that were spaced apart from each other a distance of about 15 mils. The wet film thickness of the first electrode pattern was about 0.5 mils. The polyester sheet was then passed through the 250° F. conveyorized dryer for 1.5 minutes to cure the silver conductive ink.

A dielectric layer was then applied over the front electrode pattern by screen printing a dielectric composition sold under the trade designation 7153 by DuPont Electronics of Research Triangle Park, North Carolina through a 76 mesh polyester screen. The formation of the dielectric layer required two print passes, wet on wet. The dielectric layer was cured by passing the polyester sheet through the 250° F. conveyorized dryer for 1.5 minutes. The dry film thickness of the dielectric layer was about 1.6 mils.

A rear electrode pattern was then applied over the dielectric layer by screen printing a silver conductive ink sold under the trade designation ELECTRODAG 479SS by Acheson Colloids Co. of Port Huron, Mich. through a 460 mesh polyester screen. The rear electrode pattern comprised a solid layer of silver conductive ink having a wet film thickness of about 0.5 mils. The polyester sheet was then passed through the 250° F. conveyorized dryer for 1.5 minutes to cure the silver conductive ink.

The electroluminescent circuit was then placed into a convection oven heated at a temperature of 250° for 10 minutes to fully cure the applied layers. When powered at with an alternating current at 175V/400 hz, the electroluminescent circuit yielded about 8 foot candles of light.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed:

1. A method of forming an electroluminescent circuit comprising:

screen printing a rear electrode pattern on a substrate;

screen printing a dielectric layer over said rear electrode pattern;

screen printing a front electrode pattern on said dielectric layer, said front electrode pattern comprising a plurality of opaque lines separated by spaces; and screen printing a phosphor layer over said front electrode pattern.

2. The method according to claim 1 wherein said substrate comprises a polyester film.

3. The method according to claim 1 wherein said rear electrode pattern is formed of a silver conducting ink.

4. The method according to claim 1 wherein said rear electrode pattern comprises a solid layer disposed upon said substrate.

5. The method according to claim 1 wherein said front electrode pattern is formed of a silver conducting ink.

6. The method according to claim 1 wherein at least one of said plurality of lines has a width of about 5 to about 15 mils.

7. The method according to claim 1 wherein at least one of said plurality of lines is separated from another of said plurality of lines by a space that is from about 5 to about 25 mils in width.

8. The method according to claim 1 wherein said dielectric layer is formed using at least two print passes.

9. The method according to claim 1 wherein said phosphor layer is formed using at least two print passes.

10. The method according to claim 9 wherein said print passes are applied wet on wet.

11. A method of forming an electroluminescent circuit comprising:

screen printing a phosphor layer on a substrate;

screen printing a front electrode pattern on said phosphor layer, said front electrode pattern comprising a plurality of opaque lines separated by spaces;

screen printing a dielectric layer over said front electrode pattern;

screen printing a rear electrode pattern over said dielectric layer.

12. The method according to claim 11 wherein said substrate comprises a polyester film.

13. The method according to claim 11 wherein said rear electrode pattern is formed of a silver conducting ink.

14. The method according to claim 11 wherein said rear electrode pattern comprises a solid layer disposed upon said substrate.

15. The method according to claim 11 wherein said front electrode pattern is formed of a silver conducting ink.

16. The method according to claim 11 wherein at least one of said plurality of lines has a width of about 5 to about 15 mils.

17. The method according to claim 11 wherein at least one of said plurality of lines is separated from another of said plurality of lines by a space that is from about 5 to about 25 mils in width.

18. The method according to claim 11 wherein said dielectric layer is formed using at least two print passes.

19. The method according to claim 11 wherein said phosphor layer is formed using at least two print passes.

20. The method according to claim 19 wherein said print passes are applied wet on wet.

* * * * *